US010585238B2

(12) United States Patent
Astratov et al.

(10) Patent No.: US 10,585,238 B2
(45) Date of Patent: Mar. 10, 2020

(54) PHOTODETECTOR FOCAL PLANE ARRAY SYSTEMS AND METHODS BASED ON MICROCOMPONENTS WITH ARBITRARY SHAPES

(71) Applicant: The University of North Carolina at Charlotte, Charlotte, NC (US)

(72) Inventors: Vasily N. Astratov, Charlotte, NC (US); Aaron Brettin, Sherrills Ford, NC (US); Nicholaos I. Limberopoulos, Beavercreek, OH (US); Augustine Urbas, Cincinnati, OH (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 16/006,963

(22) Filed: Jun. 13, 2018

(65) Prior Publication Data
US 2019/0004212 A1    Jan. 3, 2019

Related U.S. Application Data

(60) Provisional application No. 62/518,896, filed on Jun. 13, 2017.

(51) Int. Cl.
*G02B 6/08*    (2006.01)
*G02B 6/42*    (2006.01)
(Continued)

(52) U.S. Cl.
CPC ............ *G02B 6/08* (2013.01); *G02B 6/1225* (2013.01); *G02B 6/32* (2013.01); *G02B 6/4202* (2013.01);
(Continued)

(58) Field of Classification Search
None
See application file for complete search history.

(56) References Cited

U.S. PATENT DOCUMENTS 5,352,886 A * 10/1994 Kane .................. G01J 1/04
250/208.2
7,057,832 B2   6/2006 Wu et al.
(Continued)

OTHER PUBLICATIONS

Darafsheh et al. ("Super-Resoluation Microscopy by Dielectric Microcylinders"; IEEE, ICTON 2013) (Year: 2013).*
(Continued)

*Primary Examiner* — Michelle R Connelly
(74) *Attorney, Agent, or Firm* — Clements Bernard Walker; Christopher L. Bernard

(57) ABSTRACT

A photodetector focal plane array system having enhanced sensitivity and angle-of-view, including: a substrate including a plurality of photosensitive regions; and a microcomponent disposed adjacent to each of the plurality of photosensitive regions operable for receiving incident radiation from a relatively wider area and directing the incident radiation into a relatively smaller area of the associated photosensitive region by, in part, one or more of waveguiding and scattering; wherein each of the microcomponents is centered with respect to a photodetector mesa of each of the plurality of photosensitive regions. Each of the microcomponents includes one of a microcone, a microcuboid, a micropillar, a core-shell micropillar, a microtubule, a pyramid, an inverted pyramid, and an arbitrary shape microcomponent—with a top surface having a a selected or arbitrary cross-sectional shape and a selected or arbitrary profile.

24 Claims, 4 Drawing Sheets

(51) Int. Cl.
*H01L 27/146* (2006.01)
*G02B 6/122* (2006.01)
*G02B 6/32* (2006.01)
*G02B 6/43* (2006.01)
*B82Y 20/00* (2011.01)

(52) U.S. Cl.
CPC .......... *G02B 6/43* (2013.01); *H01L 27/14627* (2013.01); *H01L 27/14649* (2013.01); *B82Y 20/00* (2013.01)

(56) References Cited

U.S. PATENT DOCUMENTS

| | | | |
|---|---|---|---|
| 8,554,031 B2 | 10/2013 | Astratov | |
| 9,362,324 B1* | 6/2016 | Astratov | ........... H01L 27/14627 |
| 2003/0089842 A1* | 5/2003 | Moon | ...................... G01J 1/06 250/227.11 |
| 2007/0138380 A1* | 6/2007 | Adkisson | .................. G01J 1/04 250/227.11 |
| 2013/0338303 A1 | 12/2013 | Quint et al. | |
| 2018/0269251 A1* | 9/2018 | Chang | ............... H01L 27/14685 |

OTHER PUBLICATIONS

Hasan et al., "Photonic nanojet-enhanced nanometer-scale germanium photodiode," Department of Electrical and Computer Engineering, University of Utah, Jul. 24, 2013, pp. 5420-5425.

Lu et al., "A Self-Assembly Approach to the Fabrication of Patterned, Two-Dimensional Arrays of Microlenses of Organic Polymers," Advanced Materials, vol. 13, No. 1, Jan. 5, 2001, pp. 34-37.Apr. 16, 2001.

Wu et al., "Fabrication of arrays of two-dimensional micropatterns using microspheres as lenses for projection photolithography," Department of Chemistry and Chemical Biology, Harvard University, Applied Physics Letters vol. 78, No. 16, Apr. 16, 2001, pp. 2273-2275.

Wu et al., "Plasmonic enhanced quantum well infrared photodetector with high detectivity," Department of Electrical Engineering and Computer Science, Northwestern University, Applied Physics Letters 96, 2010, pp. 1-3.

Winkleman et al., "Directed Self-Assembly of Spherical Particles on Patterned Electrodes by an Applied Electric Field," Advanced Materials, 2005, pp. 1507-1511.

Schaadt et al., "Enhanced semiconductor optical absorption via surface plasmon excitation in metal nanoparticles," Applied Physics Letters 86, 2005, pp. 1-4.

Keasler et al., "A numerical study of broadband absorbers for visible to infrared detectors," Applied Physics Letters 99, 2011, pp. 1-4.

Catrysse et al., "Pixel scaling in infrared focal plane arrays," Stanford University, Feb. 18, 2013, pp. C72-C77.

Jiang et al., "Advanced monolithic quantum well infrared photodetector focal plane array integrated with silicon readout integrated circuit," Department of Electrical and Computer Engineering, Northwestern University, Oct. 13, 2003, pp. 199-207.

Lee et al., "Plasmonic-Enhanced Photodetectors for Focal Plane Arrays," IEEE Photonics Technology Letters, vol. 23, No. 14, Jul. 15, 2011, pp. 935-937.

Winkleman et al., "Templated Self-Assembly Over Patterned Electrodes by an Applied Electric Field: Geometric Constraints and Diversity of Materials," Journal of Microelectromechanical Systems, 2008, pp. 1-11.

Chen et al., "Photonic nanojet enhancement of backscattering of light by nanoparticles: a potential novel visible-light ultramicroscopy technique," Department of Electrical and Computer Engineering and Department of Biomedical Engineering, Northwestern University, vol. 12, No. 7, Apr. 5, 2004, pp. 1214-1220.

Lee et al., "Quantum dot infrared photodetector enhanced by surface plasma wave excitation," Center for High Technology Materials and Department of Electrical and Computer Engineering, University of New Mexico, vol. 17, No. 25, Dec. 7, 2009, pp. 23160-23168.

Ren et al., "Second-order surface-plasmon assisted responsivity enhancement in germanium nanophotodetectors with bull's eye antennas," Department of Electronic Materials Engineering, The Australian National University, vol. 22, No. 13, pp. 15949-15956.

Darafsheh, "Formation of polarized beams in chains of dielectric spheres and cylinders," Department of Physics and Optical Science, University of North Carolina at Charlotte, Optics Letters, vol. 38, No. 20, Oct. 15, 2013, pp. 4208-4211.

Yu et al., "Design of mid-infrared photodetectors enhanced by surface plasmons on grating structures," Stanford University, vol. 6475, pp. 1-6.

Gu et al., "Backside-configured surface plasmonic structure with over 40 times photocurrent enhancement," Department of Electrical and Computer Engineering, University of Massachusetts Lowell, Jul. 31, 2013, pp. 1-7.

* cited by examiner

PHOTODETECTOR FOCAL PLANE ARRAY SYSTEMS AND METHODS BASED ON MICROCOMPONENTS WITH ARBITRARY SHAPES

CROSS-REFERENCE TO RELATED APPLICATION

The present disclosure claims the benefit of priority of U.S. Provisional Patent Application No. 62/518,896, filed on Jun. 13, 2017, and entitled "PHOTODETECTOR FOCAL PLANE ARRAY SYSTEMS AND METHODS BASED ON MICROCOMPONENTS WITH ARBITRARY SHAPES," the contents of which are incorporated in full by reference herein.

STATEMENT OF GOVERNMENT INTEREST

The present disclosure was developed with U.S. Government/U.S. Air Force support and the Air Force Research Laboratory pursuant to Contract/Grant NSF I/U CRC Award No. 1068050. Accordingly, the U.S. Government has certain rights in the present disclosure and may practice the present invention or have the present invention practiced throughout the world.

FIELD OF THE DISCLOSURE

The present disclosure relates generally to the imaging field. More specifically, the present disclosure relates to imaging systems and methods providing for the enhanced collection of light/radiation into the individual photodetectors forming a focal plane array (FPA) or the like with a large angle-of-view (AOV). Increased light collection efficiency leads to enhanced sensitivity and increased speed of the FPA. The systems and methods of the present disclosure allow for a reduction in the size of photodetector mesas in the FPA without sacrificing the sensitivity of the FPA.

BACKGROUND OF THE DISCLOSURE

Prior work in the field of the present disclosure has taken place along three directions: (i) generally developing the concept of photonic nanojets for dielectric microspheres, microcylinders, and microfibers; (ii) generally developing the concept of photonic nanojets (via theoretical modeling) for microcomponents with arbitrary shapes, and (iii) generally developing a proposal for the large-scale integration of arrays of microspheres, microcylinders, and microfibers with FPAs for enhancing the sensitivity and AOV of imaging devices.

The concept of photonic nanojets was originally introduced and developed for focusing light by dielectric microspheres (or two-dimensional microcylinders) with refractive index contrast in the $1.4<n<2.0$ range and with diameters in the $2\lambda<D<100\lambda$ range. Microspheres and microcylinders concentrate light due to a refraction effect. They essentially operate as focusing microlenses. Calculations performed have showed that the waist of a focused beam can be below the diffraction limit, reaching values $\sim\lambda/3$ in some cases. Many applications for photonic nanojets have been proposed, including polarization filters based on chains of microspheres and focusing single-mode and multimode microprobes. More recently, an application for photonic nanojets related to focusing electromagnetic energy into a photodiode has been proposed theoretically.

More recently, it has been proposed that microcomponents with shapes different from microspheres (or microcylinders or microfibers) can be also used for creating tightly focused beams. These proposals have been based on the theoretical modeling of light propagation through such structures. In contrast to microspheres and microcylinders, the concentration of light by such microcomponents is based not only upon the refraction of light (like a lens), but also upon waveguiding and/or light scattering effects. To illustrate this distinction from microspheres and microcylinders, one example of such a microcomponent is represented by a tapered waveguide where the concentration of light is provided by total internal reflection, as opposed to refraction. The following structures have been considered: cuboids, microcones, pyramids, and axicones. It has been demonstrated that photonic jets in such structures are characterized by a substantially increased optical intensity with respect to the incident radiation and possesses narrow beam width. The length of such photonic jets can reach several particle diameters, while the transverse width can have sub-diffraction-limited dimensions. The spatial parameters of the nanojets can be varied through variation of the structural parameters of the microcomponents. In these publications, however, the use of the microcomponents for increasing the sensitivity and AOV of FPAs was not considered. In addition, the potential advantages of such structures based on their manufacturability by standard fabrication methods (in comparison with microspheres, for example) were not reported.

The enhancement of light collection efficiency by the integration of individual pixels of mid-wavelength infrared (MWIR) FPAs with individual microspheres was recently demonstrated experimentally. The mechanism of this enhancement factor is based on the collection of light from the area determined by the size of the microsphere (which can be much larger than the size of the associated photodetector mesa) and the focusing of this beam into a photodetector mesa. This principle was demonstrated for individual MWIR detectors fabricated in a structure grown on a GaSb substrate with an InAs/InAsSb type-II strained-layer superlattice (SLS) as the active materials. The maximum increase of the sensitivity as compared to the case of photodetector mesas before integration with microspheres is determined by the geometrical factor, $\sim(D/d)^2$, where D is the sphere diameter and d is the photodetector mesa diameter. An increase of sensitivity by up to $\times 100$ in a broad range of wavelengths was demonstrated experimentally.

This work directly motivated a proposal for the large-scale integration of arrays of microspheres with FPAs for enhancing the sensitivity and AOV of imaging devices. Such sensitivity enhancement is explained above. The increase in AOV is introduced by comparison with standard microlens arrays that are currently used for focusing light into individual pixels. The increase in AOV is explained by the significantly shorter focal distances offered by microspheres as compared to that in the case of weaker lenses in standard microlens arrays. As a result, at oblique incidence, the beam focused by the microspheres experiences smaller lateral shift as compared to that in the case of standard microlenses. This explains the larger AOVs in the case of the use of microspheres.

The main problem associated with developing such FPAs integrated with microspheres is connected with the difficulties in obtaining defect-free large-scale arrays of dielectric microspheres directly at the surfaces of FPAs. The microspheres in a suspension or in the form of dry powder need to be manipulated individually and precisely to form such large-scale, perfectly ordered arrays. This is an extremely difficult task since the total number of spheres in such arrays can be in a $10^4$-$10^6$ range. Traditionally, large-scale arrays of microspheres can be obtained by the techniques of directed self-assembly. Many modifications to directed self-assembly have been tried, including the self-assembly of microspheres on patterned electrodes by an applied electric field. Ordered 2-D arrays of 100-μm glass microspheres with a 1% defect rate have been obtained by this method. Another example is represented by a method using a shear force in the course of drying the suspension. One more example is represented by parallel manipulation of spheres using conventional or optoelectronic tweezers. In addition to wet fabrication techniques, the template self-assembly of microspheres into ordered 2-D arrays has been developed under dry conditions. However, these methods are not defect free and the error rate determined by the concentration of missing or interstitial spheres in such arrays usually cannot be made less than 1% even in most advanced methods, such as assembly on patterned electrodes by an applied electric field.

It has also been proposed to use a different method based on air suction through an array of microholes. This method has yielded very good results for relatively small arrays with the total number of spheres below $10^2$-$10^3$. However, for larger arrays, it has still led to error rates on the order of 1%. The missing or displaced microspheres result in broken pixels after integration with FPAs and such concentration of defects is not acceptable in many imaging devices. Smaller concentrations of defects below ~0.1% and, desirably, below ~0.01% are required in high-quality imaging applications.

Another problem is how to align the microspheres with the photodetector mesas with about 1-2 μm accuracy required for efficient coupling of photonic jets into the photodetector mesas. This needs to be achieved for very large-scale photodetector arrays.

Thus, to summarize, although the integration with microspheres (or with microcylinders or microfibers in some cases) is a promising approach for developing relatively small-scale arrays, these technologies are not defect free, and they usually result in at least 1% pixel defect rate, which is not acceptable in many of the FPA applications.

BRIEF SUMMARY OF THE DISCLOSURE

Accordingly, the present disclosure is devoted to improved systems and methods for providing the enhanced collection of light into individual photodetectors forming FPAs with large AOVs. Increased light collection efficiency leads to enhanced sensitivity and increased speed of the FPAs. It should also be noted that, in general, this disclosure allows for reducing the size of the photodetector mesas in FPAs without sacrificing the sensitivity of the FPAs. This is an important factor since smaller photodetector mesas have lower dark current which can be used for increasing the operation temperature of the FPAs. On the other hand, the large AOVs are required in many FPA applications, such as in surveillance and sensor cameras. In contrast to structures formed by microspheres, microcylinders, or microfibers, the design of the proposed microcomponents is not limited to elements with circular symmetry. Examples of the proposed microcomponents are represented by microcones with circular, square, or hexagonal cross-sections, for example. Other examples include microcuboids, micropillars, core-shell micropillars and microtubules, pyramidal and inverted pyramidal shapes, etc. Alternatively, these structures can be designed with genetic algorithms that, generally, result in arbitrary geometrical shapes of the proposed microcomponents. The critical difference as compared with microsphere or microfiber arrays is that some of the proposed microcomponents can be fabricated by well-established large-scale planar fabrication technologies, such as lithography followed by etching, by imprinting, by injection molding, or by other techniques. Another critically important difference is that these technologies can provide simple alignment of the fabricated microcomponents with the photodetector mesas on the massive scale required for developing FPA applications. This is because the fabricated microstructure is not a collection of individual elements that need to be positioned and aligned individually, but rather all elements are integrated in a single layer or slab, such that the alignment of just one or a few elements means that all other elements are also aligned. All proposed microcomponents, such as microcones, cuboids, pyramids, pillars, and, potentially, structures with more complicated geometries, have the ability to collect light from a relatively large area determined by the dimensions of the given microcomponent and to focus it down to compact beam sizes. These compact beams have a subwavelength transversal waist and they are termed "photonic nanojets" or "photonic jets." Such photonic jets can be very efficiently coupled into compact photodetector mesas. Use of some of the proposed structures, such as cuboids, for example, can be viewed as counter-intuitive since sufficiently large cuboids (characteristic dimensions >>100λ, where λ is the illumination wavelength) do not necessarily possess light-focusing capabilities. However, at the mesoscale limit (characteristic dimensions from ~λ to ~10λ), all of the proposed microcomponents with the arbitrary shapes are capable of forming tightly focused photonic jets. The physical principles of concentrating light in the proposed microstructures, however, is different from microspheres and microcylinders since they do not rely on a refraction effect. They utilize waveguiding and/or light scattering effects in addition to the refraction of light. An example is represented by tapered microcones that concentrate light due to total internal reflection, as opposed to refraction. The proposed systems and methods are thus designed for enhancing front-illuminated FPAs, but they can be also used in back-illuminated FPAs as well.

More broadly, the present disclosure relates to the development of FPAs. These arrays are widely used in developing infrared military and civil imaging systems, such as systems for guidance and control, target acquisition, surveillance, laser range-finding, fiber optic and free-space communications, thermal imaging, and other applications. More specifically, the present disclosure addresses the problem of designing FPAs capable of detecting weak optical images when the sensitivity of the optical system needs to be enhanced in order to increase the signal-to-noise ratio of the detected images.

For IR applications, the photosensitive material of the photodetector FPAs is usually fabricated from narrow band gap semiconductors, such as $Hg_{1-x}Cd_xTe$ (mercury-cadmium-telluride, MCT) or from intersubband-absorbing layered quantum structures. The pixels of the photodetector FPAs are represented by a semiconductor pin structure operating in a photovoltaic or photoconductive mode. The structure of the photodetector FPAs includes a substrate, photosensitive layer grown or fabricated on the substrate, metallic contacts, and additional layers, such as antireflection coatings. An electronic circuit for reading out the images is usually a part of the design of the photodetector FPA assembly.

The layered quantum structures are represented by quantum well or quantum dot IR photodetectors (QWIPs or QDIPs) which are usually fabricated on GaAs or InP substrates. The electronic processing circuitry can be created by using wire-bonding or by using flip-chip bonding with a silicon-based readout integrated circuit.

It is important to note that one of the main trends in the design of FPAs is based on the reduction of the pixels' sizes. Smaller pixels provide better resolution and increased spatial sampling. Reduction of the pixel sizes also results in reduced FPA dark currents. In addition, the frequency response of the individual pixels can be enhanced due to reduced capacitance. Pixel sizes in FPAs used in mid-wave IR (MWIR, $\lambda$=3-5 μm) and long-wave IR (LWIR, $\lambda$=8-12 μm) systems are being reduced below 20 μm, approaching the diffraction limit of conventional imaging optics.

For larger pixels, it is relatively straightforward to design FPAs where the area is covered with the photodetector mesas with area fill factors up to ~70%. However, for smaller pixels potentially approaching the diffraction-limited dimensions, the area fill factors drop since some space is taken by electrodes, gaps between the pixels, and corresponding circuitry. As a result, in the case of very small pixels, the FPA pitch usually becomes larger than the size of the mesa which results in reduced area fill factors and FPA sensitivities. It should be noted that one of the motivations to decrease the size of the photodetector mesas is to reduce the dark current (which is proportional to the area of the photodetector mesa). This motivation is closely related to one of the main goals in this area—increasing the operation temperature of FPAs—since the structures with reduced dark current are more suitable for operation at higher temperatures. In any case, the reduction of the size of the pixels, especially in the case of mesas reaching wavelength-scale diameters, comes at the price of the efficiency or sensitivity of FPAs. Depending on the relationship between the mesa diameter and the pitch of the FPA, the light collection efficiency of FPAs can be significantly reduced in such structures. This situation represents a problem which is solved by the present disclosure.

As a part of the background in this area, attempts to enhance the sensitivity of individual pixels by increasing their absorbance should be mentioned. This has been achieved by structuring the surface of the pixels or by fabricating plasmonic nanogratings. It has been demonstrated that the photoresponse of QWIP and QDIP structures can be enhanced by metal nanoparticles, antennas, and metal gratings fabricated on the surfaces of the devices. The idea of these designs is to couple incident light to surface plasmons bound to the metal/semiconductor interface, leading to enhanced responsivity and detectivity. Recently, the notable advance in this field has been made based on using substrate-side illumination as opposed to air-side illumination. Although all of these advancements allow increasing the absorbance of light by the individual pixels, they do not address the problem related to the pixels' area fill factor which can be limited at the level of few percent in some cases.

In one exemplary embodiment, the present disclosure provides a photodetector focal plane array system having enhanced sensitivity and angle-of-view (AOV), including: a substrate including a plurality of photosensitive regions; and a microcomponent disposed adjacent to each of the plurality of photosensitive regions operable for receiving incident radiation and directing the incident radiation into the associated photosensitive region—the microcomponent having an ability to collect the incident radiation from a wider area and concentrate it into the smaller area of the associated photosensitive region, operating based not only on the refraction of radiation (like a lens), but also on waveguiding and/or light scattering effects; wherein each of the microcomponents is centered with respect to a photodetector mesa of each of the plurality of photosensitive regions. The plurality of photosensitive regions are disposed in a photosensitive layer of the substrate. Each of the microcomponents includes one of a microcone, a microcuboid, a micropillar, a core-shell micropillar, a microtubule, a pyramid, an inverted pyramid, and an arbitrary shape microcomponent. Each of the microcomponents includes a top surface having one of a substantially circular cross-sectional shape, a substantially square cross-sectional shape, a substantially triangular cross-sectional shape, a substantially hexagonal cross-sectional shape, and an arbitrary cross-sectional shape. Each of the microcomponents includes a top surface having one of a substantially flat profile, a substantially concave profile, a substantially convex profile, a substantially corrugated profile, and an arbitrary profile. Each of the microcomponents has a diameter of between about $\lambda$ and about 100$\lambda$, wherein $\lambda$ is the wavelength of the incident radiation. Each of the microcomponents is manufactured from one of a dielectric material, a semiconductor material, a glass material, a plastic material, a polymeric material, and an elastomeric material. The dielectric material includes one or more of silica, soda-lime glass, borosilicate glass, barium titanate glass, titanium dioxide, sapphire, ruby, polystyrene, calcium fluoride, and magnesium fluoride. Each of the microcomponents has an index of refraction of between about 1.4 and about 3.5. Optionally, the semiconductor material includes one or more of silicon, germanium, and GaAs (or the like). The microcomponents are affixed to the substrate using one or more of a glue, an epoxy, a polymeric material, a photocurable material, partial or complete melting, and physical adhesion. Optionally, each of the microcomponents includes a first portion that acts as a tapering waveguide and a second portion that acts as a directional waveguide. Optionally, each of the microcomponents is coupled to a spectral filter or several different spectral filters to separate different wavelengths.

In another exemplary embodiment, the present disclosure provides a method for providing a photodetector focal plane array system having enhanced sensitivity and angle-of-view (AOV), including: providing a substrate including a plurality of photosensitive regions; and disposing a microcomponent adjacent to each of the plurality of photosensitive regions operable for receiving incident radiation and directing the incident radiation into the associated photosensitive region—the microcomponent having an ability to collect the incident radiation from a wider area and concentrate it into the smaller area of the associated photosensitive region, operating based not only on the refraction of radiation (like a lens), but also on waveguiding and/or light scattering effects; wherein each of the microcomponents is centered with respect to a photodetector mesa of each of the plurality of photosensitive regions. The plurality of photosensitive regions are disposed in a photosensitive layer of the substrate. Each of the microcomponents includes one of a microcone, a microcuboid, a micropillar, a core-shell micropillar, a microtubule, a pyramid, an inverted pyramid, and an arbitrary shape microcomponent. Each of the microcomponents includes a top surface having one of a substantially circular cross-sectional shape, a substantially square cross-sectional shape, a substantially triangular cross-sectional shape, a substantially hexagonal cross-sectional shape, and an arbitrary cross-sectional shape. Each of the microcomponents includes a top surface having one of a substantially flat profile, a substantially concave profile, a substantially convex profile, a substantially corrugated profile, and an arbitrary profile. Each of the microcomponents has a diameter of between about λ and about 100λ, wherein λ is the wavelength of the incident radiation. Each of the microcomponents is manufactured from one of a dielectric material, a semiconductor material, a glass material, a plastic material, a polymeric material, and an elastomeric material. The dielectric material includes one or more of silica, soda-lime glass, borosilicate glass, barium titanate glass, titanium dioxide, sapphire, ruby, polystyrene, calcium fluoride, and magnesium fluoride. Each of the microcomponents has an index of refraction of between about 1.4 and about 3.5. Optionally, the semiconductor material includes one or more of silicon, germanium, and GaAs (or the like). Optionally, the microcomponents are affixed to the substrate using one or more of a glue, an epoxy, a polymeric material, a photocurable material, partial or complete melting, and physical adhesion. Optionally, the photodetector focal plane array system is manufactured using a nanoscribe technique. Optionally, each of the microcomponents includes a first portion that acts as a tapering waveguide and a second portion that acts as a directional waveguide. Optionally, each of the microcomponents is coupled to a spectral filter or several different spectral filters to separate different wavelengths.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
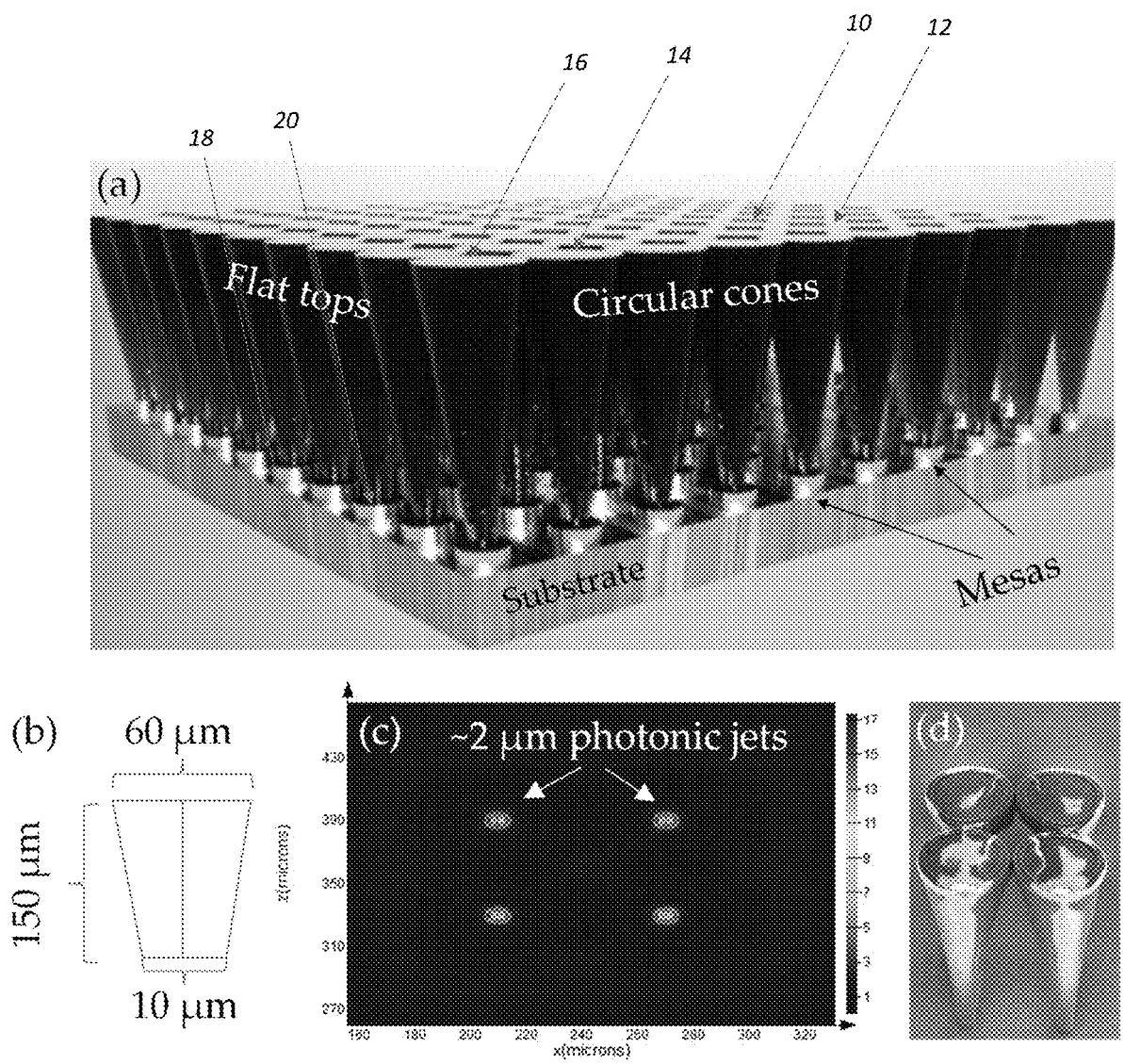
FIG. 1 is a series of schematic illustrations of (a) an array of truncated microcones with circular cross-sections aligned with the photodetector mesas of a FPA; (b) the typical dimensions of a single truncated cone in such an array; (c) the photonic jets calculated at the surface of the associated substrate; and (d) microcones fabricated using nanoscribe technology, for example.

The present disclosure is based on the idea that, instead of using microspheres, one can use microcomponents with arbitrary shapes for enhancing the sensitivity and increasing the AOV of FPAs and the like. Although the focusing capability of such microcomponents has been established theoretically, the idea of their integration with FPAs has never been proposed or even expressed in previous studies.

The key to understanding this sensitivity enhancement is the fact that each of the microcomponents has an ability to collect light from an area that is much larger than the size of the associated photodetector mesa. The microcomponent is designed to operate as a focusing element and a waveguide, either in parallel or in series. As a result, each microcomponent couples light collected from an area that is significantly larger than the individual photodetector mesa into the given mesa. In U.S. Pat. No. 9,362,324 (Astratov et al.) microcomponents with circular symmetry, such as microspheres, microcylinders, and microfibers, were proposed and described. In this disclosure, a potentially much larger realm of structures (or microcomponents) with arbitrary shapes that do not necessarily have circular symmetry are studied. It is important to stress that the basic principle of light concentration in such structures cannot be reduced to simple refraction as in the case of microspheres and microcylinders. An example of such a microstructure is represented by a microcone that operates as a tapered waveguide rather than a microlens. In such microstructures with more complicated shapes, often all optical phenomena—refraction, total internal reflection, and the scattering of light—coexist. This means that the description of their optical properties using just a single optical effect is not sufficient. Theoretically, the optical properties of such microcomponents are often described by exact numerical solutions of Maxwell's equation, which automatically takes into account all optical effects taking place in such microstructures. This diversity of the proposed shapes opens up the possibility of using different fabrication technologies. The freedom to use different technologies for such fabrication is one of the main advantages of the proposed microstructures over microspheres, microcylinders, and microfibers. It should also be noted that each microsphere must be perfectly aligned with the corresponding photodetector mesa. Although this alignment problem can, in principle, be solved by optical methods, this task is rather difficult in practice since the high-quality alignment (with a tolerance of about 1-2 microns) needs to be achieved for tens of thousands or even millions of spheres assembled in chip-scale FPA structures. In contrast, in the proposed microstructures, the individual elements are integrated in a single layer or slab. By aligning one or just a few individual elements, the whole microstructure can be automatically aligned with the photosensitive regions.

The main advantage of structures with the arbitrary shapes over dielectric microspheres is that they can be produced by well-established parallel fabrication methods, such as photolithography followed by etching, imprinting, injection molding, or the like. For such fabrication methods, the problem of alignment of the fabricated microcomponents with the photodetector mesas is easier to solve because the photomasks can be fabricated to match the dimensions of FPAs. It should be also noted that, in addition to methods of parallel fabrication, there are methods that represent essentially point-by-point fabrication, but which are totally computerized and automated. These latter methods can be also advantageous over techniques for the assembly of microspheres due to their automated nature and their ability to realize a perfect alignment of fabricated microcomponents with the photodetector mesas. An example of the latter type of fabrication is represented by a nanoscribe technology. The position of a nanoscribe relative to the mesas needs to be identified only once at the initial stage of the fabrication process. Since the fabrication process is computer programmed, the whole structure will then be fabricated in such a way that the alignment of the microcomponents with the individual photodetector mesas is preserved over large areas.

The proposed systems and methods of increasing the sensitivity and AOV of FPAs are illustrated by several embodiments, which are considered below only as examples illustrating the physical principles and realizations of this disclosure.

An embodiment represented by a microcone array 10 with microcones 12 having flat tops 14 and circular cross-sections 16 arranged in a square pattern on a substrate 18 is illustrated in FIG. 1(a). Each microcone is aligned with a corresponding photodetector mesa 20. The index of refraction of microcones is 1.5, for example, and the typical dimensions of microcones are illustrated in FIG. 1(b). This is only an example of such a structure, and the index of refraction and the geometrical dimensions are not optimized. It is seen that this structure can be viewed as a tapered waveguide. Coupling of the incident light through the wider base of each dielectric cone is followed by propagation through such tapered waveguide, which leads to a beam tapering effect. This effect was studied for plane waves incident at normal to the surface using finite-difference time-domain (FDTD) modeling at $\lambda$=1.5 µm. The calculations of EM field intensity in the plane of the substrate illustrated in FIG. 1(c) show that each microcone creates a tightly confined beam with a full width at half maximum (FWHM) of ~2 µm. For a MWIR range, the FWHM is expected to be closer to ~5 µm, which is still much smaller than the typical diameters of the photodetector mesas used in MWIR FPAs. Thus, this structure can be used for the efficient collection and focusing light into the photodetector mesas. Preliminary results show that each microcone has a relatively large AOV on the order of 10°, however further analysis is required to optimize the AOVs of such microcones. Based on the preliminary results, the AOVs of such structures (>10°) significantly exceed typical AOV values (several degrees) of standard microlens arrays. FPAs based on these designs can be fabricated by nanoscribe technology, for example, as illustrated in FIG. 1(d).

An embodiment represented by a micro-cone array 30 with microcones 32 having flat tops 34 and square and hexagonal cross-sections 36 is illustrated in FIGS. 2(a) and 2(b), respectively. The array of square microcones is coupled into a square array of photodetectors, including a substrate 38 and the associated photodetector mesas 40. The array of hexagonal microcones is coupled into a triangular array of photodetectors, for example. A purely geometrical advantage of these arrays over the circular microcones illustrated in FIG. 1(a) is associated with their fill-factors, approaching 100%. The fabrication of such arrays is less straightforward as compared to the previous embodiment, but the nanoscribe technology can still be used for this purpose.

Figure 3:
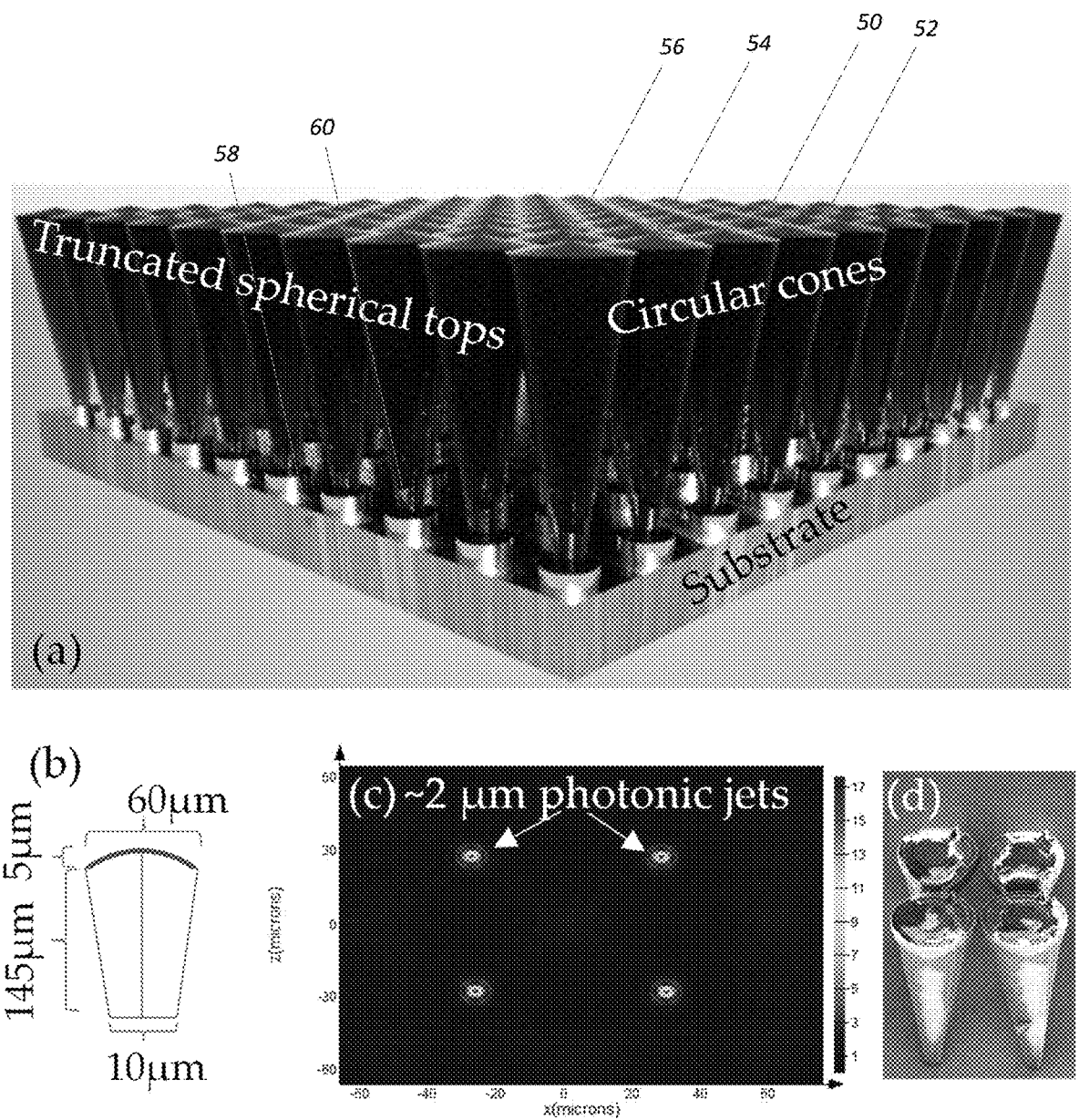
FIG. 3 is a series of schematic illustrations of (a) a square array of microcones with circular cross-sections and truncated spherical tops; (b) the typical dimensions of a single cone with a truncated spherical top in such an array; (c) the photonic jets calculated at the surface of the associated substrate; and (d) microcones with truncated spherical tops fabricated using nanoscribe technology, for example.

An embodiment represented by a micro-cone array 50 with microcones 52 having truncated spherical tops 54 and circular cross-sections 56 is illustrated in FIG. 3(a), including a similar substrate 58 and photodetector mesas 60 This structure behaves similar to the flat-top structure illustrated in FIG. 1(a) in many ways. In principle, it might provide higher AOVs, but this requires further optimization. The typical dimensions, calculated EM field intensity at the surface of the FPA, and a practical realization of this embodiment are illustrated in FIGS. 3(b-d), respectively.

Figure 4:
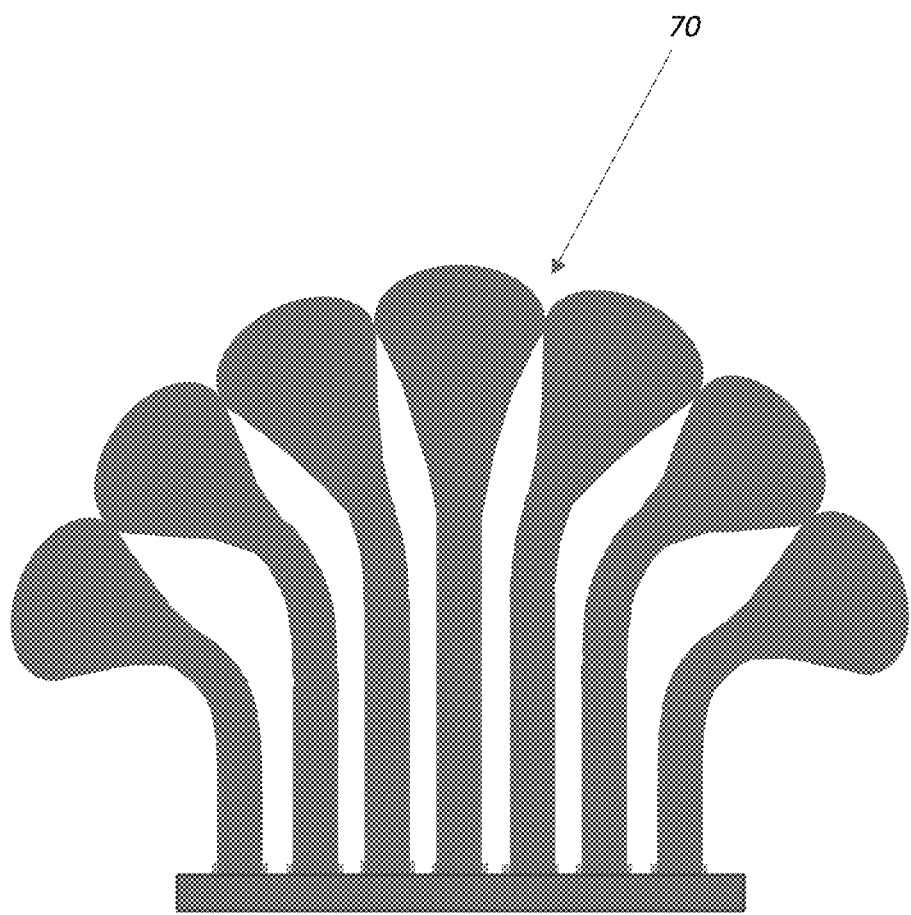
FIG. 4 is a schematic illustration of an apposition eye based on an array of microcones integrated with waveguides to provide maximal AOV that, in principle, can reach 90 degrees.

Other embodiments include structures that are suitable for developing systems with maximal AOV, such as an apposition eye 70 with a half space visibility, as schematically illustrated in a 2-D case in FIG. 4. In this design, different functions provided by different sections of the proposed microcomponent are separated. The conical section is used mainly for tapering the beam, whereas the bent cylindrical section, which is essentially a microfiber, is used for guiding the tapered beam to the associated photodetector mesa. Due to the fact that the bending losses can be rather small in curved dielectric waveguides, the whole system can be designed to cover the maximal observation angle equal to the half-space. Such systems can be used for developing motion trackers, as well as in image sensors and surveillance cameras, for example.

Figure 2:
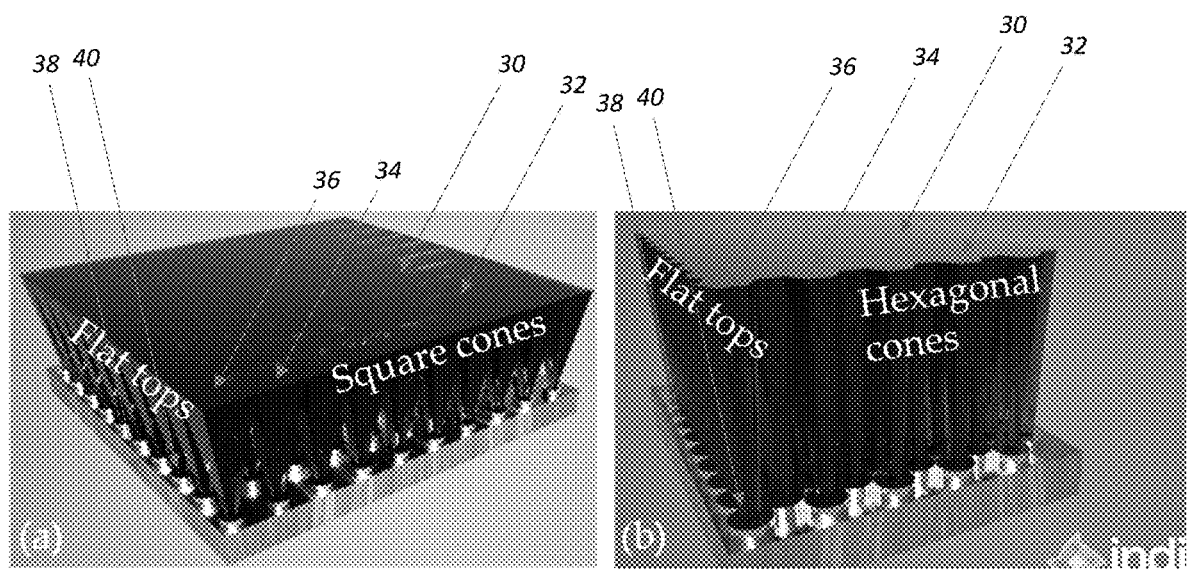
FIG. 2 is a series of schematic illustrations of (a) a square array of microcones with square cross-sections and (b) a triangular array with hexagonal cross-sections—the area fill-factor for filling the top surface with the microcones is close to unity.

Other embodiments include structures that are similar to the arrays illustrated in FIGS. 1-3, but where the microcones are replaced with such elements as microcuboids, micropillars, core-shell micropillars and microtubules, pyramidal and inverted pyramidal shapes, etc. Other embodiments include structures with arbitrary shapes that are designed to maximize the sensitivity and AOV using genetic algorithms. Other embodiments include structures where various microcomponents are combined with spectral filters to collect both spatial and spectral data. The technology of combining spectral filters with the microlens arrays is used in conventional cameras operating in the visible regime. This technology results in "red," "green," and "blue" pixels that provide maximal sensitivity in the red, green and blue parts of the visible spectrum, respectively. Similar ideas for multispectral imaging systems can be combined with the microcomponents proposed and developed in this disclosure for MWIR and LWIR imaging.

Using numerical modeling, the focusing capability of microcones with a circular cross section, as shown in FIGS. 1(c) and 3(c), has been demonstrated. Using nanoscribe technology, the fabrication of such structures is feasible. It should be noted, however, that fabrication by nanoscribe technology is relatively slow because it is performed point by point over broad areas. The techniques of parallel fabrication are more promising for large-scale production of the proposed microcomponents. Examples of such techniques are represented by lithography followed by etching, imprinting, injection molding, and by other techniques. In order to integrate the microcomponent at the surface of the FPA, it can be either initially fabricated at such surface using, for example, fabrication in a layer of photoresist deposited at the top of the FPA or it can be fabricated separately and then transferred on the FPA surface. The alignment of microcomponents with photosensitive areas need to be tested, but the task is simplified compared to the case of microspheres, where the individual elements are separate items.

These systems and methods are of interest to people using MWIR imaging devices, such as night vision devices, thermal imaging devices, goggles to see through smog, systems for terrestrial communication or sensing in poor visibility conditions, and systems used for imaging in fog conditions on civilian or navy ships, by way of non-limiting example only.

The present disclosure addresses several important needs. The first need is related to the ability to see weak images with improved sensitivity. The images can become weak for various reasons. As an example, the objects can be small or hidden. Another reason is connected with the presence of fog or smog, so that the medium becomes turbid. In all of these cases, it is important to increase the signal-to-noise ratio for the images, which requires better sensitivity of the mid-IR cameras.

The second need is connected with the ability to see objects coming into the camera's field of view from different directions and angles. Indeed, the standard solution to the sensitivity problem is based on using commercial microlens arrays. However, such arrays have a narrow AOV, typically on the order of 1-2°. This means that they work for imaging distant objects, such as the astronomical objects. However, they are usually less suitable for imaging objects coming in the camera's field-of-view from different directions and angles. Examples of such applications are motion trackers and imaging sensors, which might have the task of detecting objects at different observation angles. Such objects can be invisible to a camera equipped with a microlens array, but these objects can be detected by cameras where the FPAs are enhanced as the result of integration with the proposed microcomponents.

The third need is connected with the tendency to increase the operating temperature of MWIR imaging devices. The microcomponents proposed in this disclosure allow reducing the photodetector mesa areas, which leads to the reduction of the dark current of the photodetectors. In principle, it allows one to increase the operation temperature of the imaging system. The operating temperature is a significant factor currently since high-quality imaging in the MWIR range requires the cooling of the detector to liquid nitrogen temperatures, which makes the cameras bulky and expensive. Achieving high-quality imaging at room temperature is a big goal in this field, and using smaller mesas enhanced by the proposed microcomponents is a way to increase the operation temperature.

Potential markets for this technology include companies and governmental laboratories working on increasing the sensitivity of current MWIPs and LWIPs. Current IR multi-spectral imagers are large and difficult to integrate on small size, weight, and power (SWaP)-limited platforms, such as Puma, Shadow, and Tube Launched Expendable UAS (TLEU). The deficiency of these imagers is their large optical systems, which are needed to simultaneously collect both spatial and spectral data. Detecting weak signals requires large objective diameters, which translate into the large size and weight of the optical system. Integration with the proposed microcomponents opens a unique way of solving this problem by increasing of the response of the system and reducing its dark current by orders of magnitude.

One of the competing approaches to solving the problems addressed by this disclosure is represented by the concept of a flat metamaterial lens. Due to its planar design and potentially short focal lengths, this concept attracted significant interest recently. In particular, the design of such flat lens has been proposed based on a stack of strongly coupled waveguides sustaining backward waves. As a result, such metamaterial exhibits a negative index of refraction to incoming light regardless of its incidence angle. It should be noted, however, that the concept of the flat metamaterial lens has some drawbacks that are not totally overcome at the present time. These include a relatively narrow spectral range of operation, inevitable absorption losses in the metallic layers, and somewhat complicated fabrication. Overall, this concept still requires significant development before it can become a practical solution for solving the problems addressed by this disclosure.

Another competing approach is based on using standard photolithography techniques, which allows the fabrication of 2-D arrays of microlenses. The fabrication of microlenses by melting and the reflow of photoresist has some advantages because it is based on using established planar technologies, such as photolithography, etching, etc. For this reason, it allows for the reproducible fabrication of 2-D arrays of microlenses over wide areas. However, the dome-shaped microlenses fabricated by this method have a limited refractive index contrast and, most importantly, they are not completed spheres. As a result, their focal distance is much longer than in the methods and systems proposed in this disclosure. For photodetector applications, such 2-D arrays of microlenses can be suitable only for focusing light at very large depth inside the structure. In this sense, such arrays cannot compete with the compact nanojet-producing microcomponents, which operate based on focusing and waveguiding, as proposed in this disclosure. The proposed microcomponents have shorter effective focal distances that explain their superior AOVs.

Another competing approach is based on using microspheres embedded in thin films. Such microspheres have been used as lenses for projection photolithography. For photodetector applications, the spheres need to be aligned with the photosensitive mesas. This problem is rather difficult to solve in practice.

Another competing approach is based on using microspheres or microfibers that are assembled using air suction through arrays of microholes. This method allows for obtaining ordered arrays with potentially better results than in methods of directed self-assembly. However, the defect error-rate is currently close to ~1%, which is not sufficient for developing high-quality imaging systems. In addition, the problem of the precise alignment of each microsphere with the corresponding photodetector mesa is rather difficult in large-scale arrays.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims for all purposes.

What is claimed is:

1. A photodetector focal plane array system having enhanced sensitivity and angle-of-view (AOV), comprising:
   a substrate comprising a plurality of photosensitive regions; and
   a microcomponent disposed adjacent to each of the plurality of photosensitive regions operable for receiving incident radiation from a relatively wider area and directing the incident radiation into a relatively smaller area of the associated photosensitive region by, in part, one or more of waveguiding and scattering;
   wherein each of the microcomponents is centered with respect to a photodetector mesa of each of the plurality of photosensitive regions; and
   wherein each of the microcomponents has a diameter of between about $\lambda$ and about $100\lambda$, wherein $\lambda$ is the wavelength of the incident radiation, with a diameter directly adjacent to each of the plurality of photosensitive regions of about $10\lambda$ or less such that each of the microcomponents is adapted to form a photonic nanojet that is directed into the respective photosensitive region.

2. The photodetector focal plane array system of claim 1, wherein the plurality of photosensitive regions are disposed in a photosensitive layer of the substrate.

3. The photodetector focal plane array system of claim 1, wherein each of the microcomponents comprises one of a microcone, a microcuboid, a micropillar, a core-shell micropillar, a microtubule, a pyramid, an inverted pyramid, and an arbitrary shape microcomponent.

4. The photodetector focal plane array system of claim 1, wherein each of the microcomponents comprises a top surface having one of a substantially circular cross-sectional shape, a substantially square cross-sectional shape, a substantially triangular cross-sectional shape, a substantially hexagonal cross-sectional shape, and an arbitrary cross-sectional shape.

5. The photodetector focal plane array system of claim 1, wherein each of the microcomponents comprises a top surface having one of a substantially flat profile, a substantially concave profile, a substantially convex profile, a substantially corrugated profile, and an arbitrary profile.

6. The photodetector focal plane array system of claim 1, wherein each of the microcomponents is manufactured from one of a dielectric material, a semiconductor material, a glass material, a plastic material, a polymeric material, and an elastomeric material.

7. The photodetector focal plane array system of claim 6, wherein the dielectric material comprises one or more of silica, soda-lime glass, borosilicate glass, barium titanate glass, titanium dioxide, sapphire, ruby, polystyrene, calcium fluoride, and magnesium fluoride.

8. The photodetector focal plane array system of claim 6, wherein the semiconductor material comprises one or more of silicon, germanium, and GaAs.

9. The photodetector focal plane array system of claim 1, wherein each of the microcomponents has an index of refraction of between about 1.4 and about 3.5.

10. The photodetector focal plane array system of claim 1, wherein the microcomponents are affixed to the substrate using one or more of a glue, an epoxy, a polymeric material, a photocurable material, partial or complete melting, and physical adhesion.

11. The photodetector focal plane array system of claim 1, wherein each of the microcomponents comprises a first portion that acts as a tapering waveguide and a second portion that acts as a directional waveguide.

12. The photodetector focal plane array system of claim 1, wherein each of the microcomponents is coupled to one or more spectral filters.

13. A method for providing a photodetector focal plane array system having enhanced sensitivity and angle-of-view (AOV), comprising:
providing a substrate comprising a plurality of photosensitive regions; and
disposing a microcomponent adjacent to each of the plurality of photosensitive regions operable for receiving incident radiation from a relatively wider area and directing the incident radiation into a relatively smaller area of the associated photosensitive region by, in part, one or more of waveguiding and scattering;
wherein each of the microcomponents is centered with respect to a photodetector mesa of each of the plurality of photosensitive regions; and
wherein each of the microcomponents has a diameter of between about $\lambda$ and about $100\lambda$, wherein $\lambda$ is the wavelength of the incident radiation, with a diameter adjacent to each of the plurality of photosensitive regions of about $10\lambda$ or less such that each of the microcomponents is adapted to form a photonic nanojet that is directed into the respective photosensitive region.

14. The method for providing the photodetector focal plane array system of claim 13, wherein the plurality of photosensitive regions are disposed in a photosensitive layer of the substrate.

15. The method for providing the photodetector focal plane array system of claim 13, wherein each of the microcomponents comprises one of a microcone, a microcuboid, a micropillar, a core-shell micropillar, a microtubule, a pyramid, an inverted pyramid, and an arbitrary shape microcomponent.

16. The method for providing the photodetector focal plane array system of claim 13, wherein each of the microcomponents comprises a top surface having one of a substantially circular cross-sectional shape, a substantially square cross-sectional shape, a substantially triangular cross-sectional shape, a substantially hexagonal cross-sectional shape, and an arbitrary cross-sectional shape.

17. The method for providing the photodetector focal plane array system of claim 13, wherein each of the microcomponents comprises a top surface having one of a substantially flat profile, a substantially concave profile, a substantially convex profile, a substantially corrugated profile, and an arbitrary profile.

18. The method for providing the photodetector focal plane array system of claim 13, wherein each of the microcomponents is manufactured from one of a dielectric material, a semiconductor material, a glass material, a plastic material, a polymeric material, and an elastomeric material.

19. The method for providing the photodetector focal plane array system of claim 18, wherein the semiconductor material comprises one or more of silicon, germanium, and GaAs.

20. The method for providing the photodetector focal plane array system of claim 13, wherein the dielectric material comprises one or more of silica, soda-lime glass, borosilicate glass, barium titanate glass, titanium dioxide, sapphire, ruby, polystyrene, calcium fluoride, and magnesium fluoride.

21. The method for providing the photodetector focal plane array system of claim 13, wherein each of the microcomponents has an index of refraction of between about 1.4 and about 3.5.

22. The method for providing the photodetector focal plane array system of claim 13, wherein the photodetector focal plane array system is manufactured using a nanoscribe technique.

23. The method for providing the photodetector focal plane array system of claim 13, wherein each of the microcomponents comprises a first portion that acts as a tapering waveguide and a second portion that acts as a directional waveguide.

24. The method for providing the photodetector focal plane array system of claim 13, wherein each of the microcomponents is coupled to one or more spectral filters.

* * * * *